(12) United States Patent
Meier et al.

(10) Patent No.: US 11,099,484 B2
(45) Date of Patent: Aug. 24, 2021

(54) METHOD FOR REPAIRING REFLECTIVE OPTICAL ELEMENTS FOR EUV LITHOGRAPHY

(71) Applicant: Carl Zeiss SMT GmbH, Oberkochen (DE)

(72) Inventors: Robert Meier, Munich (DE); Holger Kierey, Aalen (DE); Christof Jalics, Heidenheim (DE); Eric Eva, Aalen (DE); Ralf Winter, Gmuend (DE); Arno Schmittner, Koenigsbronn (DE); Alexey Kuznetsov, Zaltbommel (NL); Vitaliy Shklover, Heidenheim (DE); Christoph Nottbohm, Ulm (DE); Wolfgang Merkel, Neu-Ulm (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/433,572

(22) Filed: Jun. 6, 2019

(65) Prior Publication Data
US 2019/0302628 A1    Oct. 3, 2019

Related U.S. Application Data

(63) Continuation of application No. PCT/EP2017/080645, filed on Nov. 28, 2017.

(30) Foreign Application Priority Data

Dec. 6, 2016    (DE) .......................... 102016224200.8

(51) Int. Cl.
*G03F 7/20* (2006.01)
*G21K 1/06* (2006.01)

(52) U.S. Cl.
CPC ...... *G03F 7/70316* (2013.01); *G03F 7/70808* (2013.01); *G21K 1/062* (2013.01)

(58) Field of Classification Search
CPC ..... G03F 1/24; G03F 1/22; G03F 1/52; G03F 1/72; G03F 1/76; G03F 7/091; G03F 1/48;
(Continued)

(56) References Cited

U.S. PATENT DOCUMENTS 7,598,503 B2    10/2009    Van Herpen et al.
8,921,015 B2    12/2014    Li et al.
(Continued)

FOREIGN PATENT DOCUMENTS

DE    102007028172 A3    12/2008
DE    102009045008 A1    4/2010
(Continued)

OTHER PUBLICATIONS

International Preliminary Report on Patentability, PCT/EP2017/080645, Jun. 11, 2019, 7 pages.
German Examination Report with English translation, 10 2016 224 200.8, Jun. 30, 2017, 12 pages.
(Continued)

*Primary Examiner* — Mesfin T Asfaw
(74) *Attorney, Agent, or Firm* — Edell, Shapiro & Finnan, LLC

(57) ABSTRACT

A cost-effective method for repairing reflective optical elements for EUV lithography. These optical elements (60) have a substrate (61) and a coating (62) that reflects at a working wavelength in the range between 5 nm and 20 nm and is damaged as a result of formation of hydrogen bubbles. The method includes: localizing a damaged area (63, 64, 65, 66) in the coating (62) and covering the damaged area (63, 64, 65, 66) with one or more materials having low hydrogen
(Continued)

permeability by applying a cover element to the damaged area. The cover element is formed of a surface structure, a convex or concave surface, or a coating corresponding to the coating of the reflective optical element, or a combination thereof. The method is particularly suitable for collector mirrors (70) for EUV lithography. After the repair, the optical elements have cover elements (71, 72, 73).

20 Claims, 4 Drawing Sheets

(58) Field of Classification Search
CPC ............... G03F 7/702; G03F 7/70283; G03F 7/70958; G03F 7/70316; G03F 7/70808; G03F 7/7085; G03F 7/7015; G03F 7/70308; G03F 7/70891; G03F 7/70925; G03F 7/70233; G03F 7/70175; G03F 7/70166; G03F 1/68; G03F 7/70225; G03F 7/20; G03F 7/70358; G02B 5/0891; G02B 1/10; G02B 5/208; G02B 5/0833; G02B 1/115; G02B 1/005; G02B 26/0825; G21K 1/062; G21K 2201/067; G21K 2201/061; B22F 7/062; G01Q 30/02; B82Y 10/00; G01N 21/55; G01N 21/95; G03B 27/68; G02F 1/0128
See application file for complete search history.

(56) References Cited

U.S. PATENT DOCUMENTS

| | | |
|---|---|---|
| 2005/0109278 A1 | 5/2005 | Liang et al. |
| 2007/0202423 A1 | 8/2007 | Tanabe et al. |
| 2008/0318138 A1 | 12/2008 | Holfeld |
| 2011/0279799 A1 | 11/2011 | Singer et al. |
| 2015/0030970 A1* | 1/2015 | Chu .................... G03F 1/24 430/5 |
| 2015/0070713 A1 | 3/2015 | McIntyre |
| 2015/0072270 A1* | 3/2015 | Yu ..................... G03F 1/80 430/5 |
| 2015/0104732 A1 | 4/2015 | Huang et al. |
| 2016/0377988 A1* | 12/2016 | Paul ................. G21K 1/062 359/355 |
| 2017/0160639 A1 | 6/2017 | Ehm et al. |

FOREIGN PATENT DOCUMENTS

| | | |
|---|---|---|
| WO | 03003115 A1 | 1/2003 |
| WO | 2014139694 A1 | 9/2014 |
| WO | 2016023840 A1 | 2/2016 |
| WO | 2016128029 A1 | 8/2016 |

OTHER PUBLICATIONS

International Search Report, PCT/EP2017/080645, Feb. 9, 2018, 4 pages.

* cited by examiner

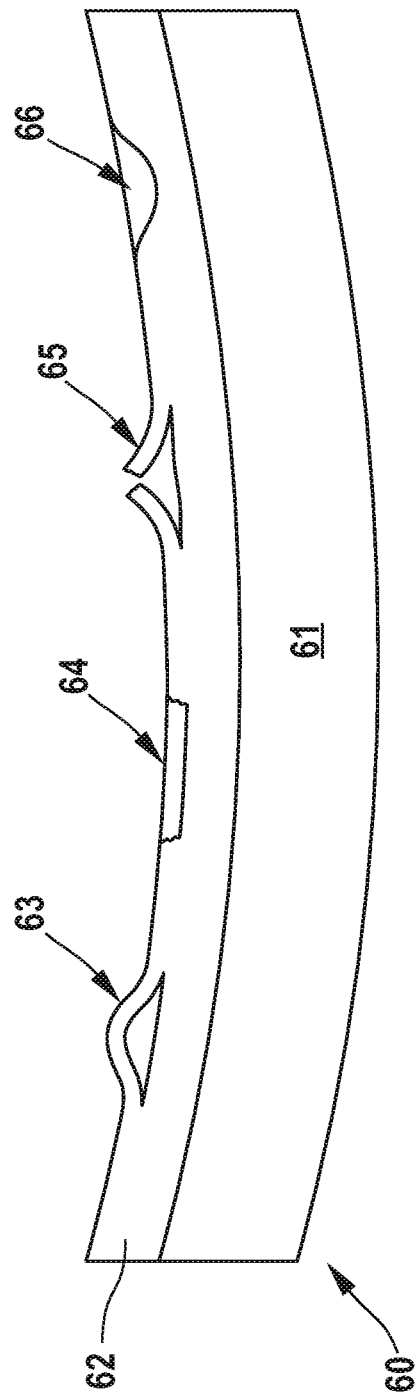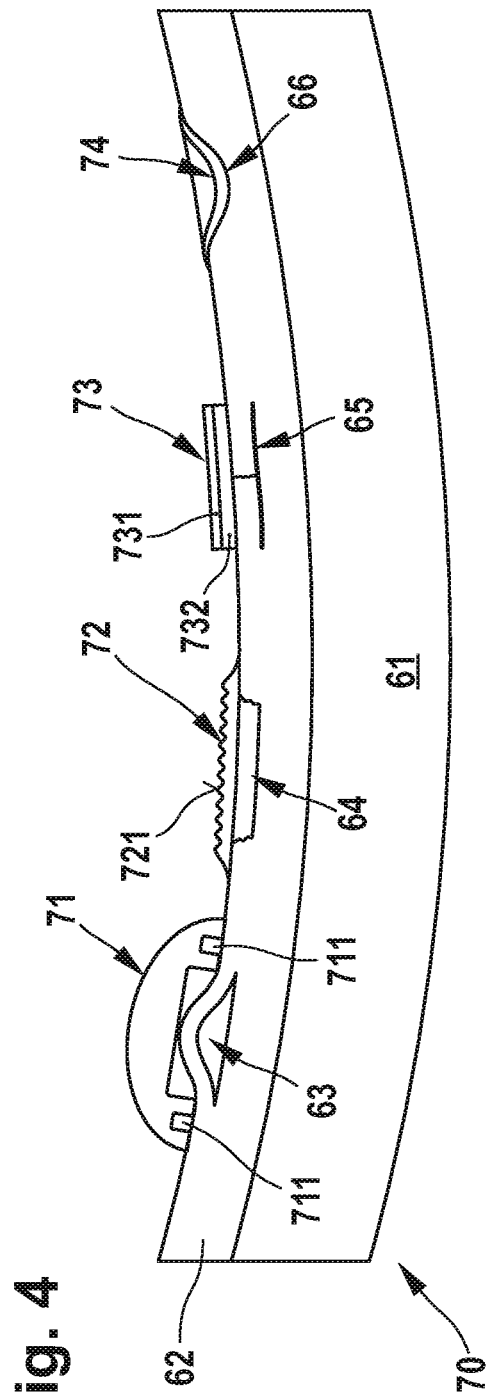

METHOD FOR REPAIRING REFLECTIVE OPTICAL ELEMENTS FOR EUV LITHOGRAPHY

CROSS REFERENCE TO RELATED APPLICATIONS

This is a Continuation of International Application PCT/EP2017/080645, which has an international filing date of Nov. 28, 2017, and which claims the priority of German Patent Application 10 2016 224 200.8, filed Dec. 6, 2016. The disclosures of both applications are incorporated in their respective entireties into the present Continuation by reference.

FIELD OF THE INVENTION

The present invention relates to a method for repairing reflective optical elements for EUV lithography which comprise a substrate and a coating that reflects at an operating wavelength in the range of between 5 nm and 20 nm. Furthermore, the present invention relates to a collector mirror for EUV lithography which comprises a substrate and a coating that reflects at an operating wavelength in the range of between 5 nm and 20 nm.

BACKGROUND

In EUV lithography apparatuses, for the lithography of semiconductor components, use is made of reflective optical elements for the extreme ultraviolet (EUV) wavelength range (e.g. wavelengths between approximately 5 nm and 20 nm) such as, for instance, photomasks or mirrors on the basis of multilayer systems for quasi-normal incidence or mirrors having a metallic surface for grazing incidence. Since EUV lithography apparatuses generally have a plurality of reflective optical elements, they must have as high a reflectivity as possible to ensure sufficiently high overall reflectivity. The reflectivity and the lifetime of the reflective optical elements may be reduced by contamination of the optically used coating of the reflective optical elements, which arises on account of the short-wave irradiation together with residual gases in the operating atmosphere. Since a plurality of reflective optical elements are usually arranged one behind another in an EUV lithography apparatus, even relatively small contaminations on each individual reflective optical element already affect the overall reflectivity to a relatively great extent.

Contamination can occur for example on account of moisture residues. In this case, water molecules are cleaved by the EUV radiation and the resulting oxygen radicals oxidize the optically active surfaces of the reflective optical elements. A further contamination source is hydrocarbons which can originate for example from the vacuum pumps used in EUV lithography apparatuses or from residues of photoresists which are used on the semiconductor substrates to be patterned and which, under the influence of the operating radiation, lead to carbon contaminations on the reflective optical elements. In the case of collector mirrors used in conjunction with a laser-based EUV plasma light source, the material which is excited to form a plasma, for example tin, occurs as an additional contamination source. While oxidative contaminations are generally irreversible, in particular carbon contaminations and possibly tin can be removed inter alia by treatment with reactive hydrogen, by virtue of the reactive hydrogen reacting therewith to form volatile compounds. Reactive hydrogen can be hydrogen radicals or else ionized hydrogen atoms or molecules.

It has been observed, however, that under the influence of reactive hydrogen which is used for cleaning or which can arise on account of the interaction of the EUV radiation with hydrogen present in the residual atmosphere, blistering at the reflective coating and even detachment of layers or individual plies can occur, in particular close to the surface of multilayer systems. Macroscopic blistering or delamination is observed in particular in the case of collector mirrors, which are especially exposed to reactive hydrogen compared with other reflective optical elements of an EUV lithography apparatus. Blistering or delamination can occur in particular at defects in the coating of the reflective optical elements.

The delamination is caused by the penetration of reactive hydrogen into the reflective coating, in particular at mechanical defects or defects that occurred during the coating. The indiffused reactive hydrogen can recombine to form molecular hydrogen and thus lead to blistering and, in the worst case, breaking up or peeling of the coating. Damaged locations of this type may have a high reflection in the infrared wavelength range. This is problematic particularly in the case of collector mirrors. This is because the highest thermal load occurs in the case of collector mirrors, inter alia on account of the infrared lasers that can be used in the radiation source, and upon reflection of the thermal radiation in the direction of the beam path of the EUV lithography apparatus it is possible, in particular, for the downstream reflective optical elements to be damaged.

The previous approach has hitherto consisted in repairing reflective optical elements damaged in particular by hydrogen-induced blistering by completely removing the damaged coating and coating the substrate anew.

SUMMARY

It is an object of the present invention to provide an alternative way of repairing reflective optical elements for EUV lithography that have been damaged by hydrogen.

This object is achieved with a method for repairing reflective optical elements for EUV lithography which comprise a substrate and a coating that reflects at an operating wavelength in the range of between 5 nm and 20 nm, comprising:
localizing a damaged location in the coating;
covering the damaged location with one or more materials by applying a covering element to the damaged location, wherein the covering element is embodied with a surface structure, a convex or concave surface or a coating corresponding to the coating of the reflective optical element, or a combination thereof.

Coating should be understood to mean both coatings on the basis of multilayer systems which are suitable particularly for normal and quasi-normal incidence and are based on Bragg reflection, and coatings having only one or a few layers which are suitable for grazing incidence and are based on total internal reflection. Moreover, the coating can comprise additional layers such as, inter alia, protective layer systems as vacuum seal, polishing or smooth layers on the substrate or spectral filter layers for deflecting undesired radiation wavelength ranges such as infrared radiation, for instance.

The process of localizing damaged locations, in particular blisters, spalling, scratches and cracks, can take place manually with close visual inspection, since these damaged locations have a macroscopic extent in many cases. It can also take place with the assistance of inspection systems that scan the surface of the coating.

It has been found that as a result of the targeted covering of the damaged locations with a covering element composed of one or more materials, in particular having low hydrogen permeability, it is possible to achieve a sufficiently permanent repair of damaged reflective optical elements with low temporal and monetary expenditure in order to be able to withstand operation of an EUV lithography apparatus. Moreover, the covering elements can already be prepared as items in stock and, if a damaged location is localized during an inspection, can be applied immediately or, if appropriate, adapted rapidly to the surface shape in order to achieve the best possible covering. This allows very fast repair. A surface structure can contribute to the fact that undesired radiation components such as from the ultraviolet or infrared wavelength range, for example, are reflected in a different direction than the radiation in the operating wavelength range. This can also be achieved with convex or concave surfaces. Covering units in the form of convex caps are particularly preferred. They additionally have the advantage that they can cover blisters and spalling equally well. A coating corresponding to the reflective coating on the surface of the covering element can lead to an increased reflectivity in the operating wavelength range at the repaired location; the reflectivity is ideally as high as at an undamaged location.

Advantageously, the covering element is secured on the coating of the reflective optical element with an adhesive. The covering element can be secured over the whole area or by applying adhesive spots or partial areas or lines. Preference is given to using adhesives which are heat-resistant and/or outgas as little as possible in a vacuum. Further suitable possibilities for securing covering elements are, inter alia, soldering, welding, in particular spot welding, or wringing.

Preferably, the covering element is embodied as a film or a covering unit. A covering unit has the advantage of greater mechanical stability and that it can be prefabricated. A film can be better adapted ad hoc to the damaged location to be repaired and to the surface profile of the coating in the region of the damaged location.

Preferably, the covering element is embodied with an angular and/or curved boundary. In particular, the covering element can have a round, angular, polygonal or totally free shape. Advantageously, in this case, the boundary is adapted to the shape of the damaged location. Particularly preferably, the covering element has an ellipsoidal or elongate shape. By means of a suitable choice of the orientation relative to the scanning direction of an EUV lithography apparatus in which the reflective optical element is used, it is thereby possible to reduce the influence of the covering element in the form of an abrupt bright-dark transition, such that the imaging performance of the EUV lithography apparatus is detrimentally affected to a lesser extent by the repair of the reflective optical element with a covering element.

Preferably, a covering element is applied which comprises one or more materials of the group comprising metal, steel, high-grade steel, Invar, aluminum, molybdenum, tantalum, niobium, silicon, titanium, zirconium, hafnium, scandium, yttrium, lanthanum, cerium, copper, silver, gold, platinum, rhodium, palladium, ruthenium, glass, ceramic and aluminum oxide. In the case of these materials, it has been found that particularly little reactive hydrogen penetrates into them. Moreover, covering units or films can be fabricated well from these materials. Furthermore, there exist securing possibilities, in particular adhesives, in order to secure such covering elements well on the coating of the reflective optical element to be repaired.

In preferred embodiments, a covering coating is applied to the damaged location. A covering coating is primarily suitable for reducing further delamination of the coating as much as possible in the event of blisters that have undergone spalling.

Preferably, the covering coating is applied by tin plating, gold plating, electroplating, oxidation, nitriding and/or deposition by atmospheric pressure plasma. Tin plating and gold plating can take place for example with metal melts or films. The procedures mentioned have all proved to be worthwhile for applying to damaged locations of the coating of reflective optical elements material that covers the damaged location. In this regard, enlargement of the damaged location can be suppressed. The procedures can be combined with one another in order to apply different layers to the damaged location. Applying a covering coating can be carried out manually or in an automated manner with the aid of a robot arm, for example.

Advantageously, as the covering coating, a metal layer comprising gold, platinum, rhodium, palladium, ruthenium, molybdenum, tantalum, niobium, silicon, titanium, zirconium, hafnium, aluminum, scandium, yttrium, lanthanum and/or cerium is applied by electroplating or a covering coating comprising one or more of the group comprising molybdenum, tantalum, niobium, silicon, titanium, zirconium, hafnium, aluminum, scandium, yttrium, lanthanum, cerium, oxides thereof, nitrides thereof, carbides thereof, borides thereof, gold, platinum, rhodium, palladium, ruthenium, carbon, boron carbide and boron nitride is applied by atmospheric pressure plasma. These materials firstly adhere well on the customary coating materials of reflective optical elements and secondly afford good protection against reactive hydrogen.

In preferred embodiments, before the process of covering the damaged location, coating material is removed in the region of said damaged location. In particular before applying a film, a covering unit or a covering coating, expansion of the damaged location over time can be better avoided this pretreatment. The strength and the endurance of the covering elements or of the covering coating can also be increased as a result.

Furthermore, the object is achieved with a collector mirror for EUV lithography which comprises a substrate and a coating that reflects at an operating wavelength in the range of between 5 nm and 20 nm, wherein the coating locally comprises a covering element, wherein the covering element comprises a surface structure, a convex or concave surface or a coating corresponding to the coating of the collector mirror, or a combination thereof.

It has been found that collector mirrors which have been repaired with covering elements owing to hydrogen-induced damaged locations have a good resistance to further hydrogen-induced damaged locations at the repaired locations even after a cleaning cycle with reactive hydrogen or during ongoing operation together with a plasma radiation source. Moreover, the repair expenditure is lower than in the case of removing and reapplying the coating to the collector mirror. In particular, the outage times of an EUV lithography apparatus in which the collector mirror is used are significantly reduced. A surface structure can contribute to the fact that undesired radiation components such as from the infrared wavelength range, for example, are reflected in a different direction than the radiation in the operating wavelength range. This can also be achieved with convex or concave surfaces. Covering units in the form of convex caps are particularly preferred. They additionally have the advantage that they can cover blisters and spalling equally well and the latter reflect in particular long-wave radiation such as infrared radiation in no preferred direction. A coating corresponding to the reflective coating on the surface of the covering element can lead to an increased reflectivity in the operating wavelength range at the repaired location; the reflectivity is ideally as high as at an undamaged location. Further preferred configurations of covering units are laminae or thin sheets, for example.

In preferred embodiments, the covering element is embodied as a film or a covering unit. A covering unit has the advantage of greater mechanical stability and that it can be prefabricated. A film can be better adapted ad hoc to the damaged location to be repaired and to the surface profile of the coating in the region of the damaged location.

Preferably, the covering element comprises one or more of the materials of the group metal, steel, high-grade steel, Invar, aluminum, molybdenum, tantalum, niobium, silicon, titanium, zirconium, hafnium, scandium, yttrium, lanthanum, cerium, copper, silver, gold, platinum, rhodium, palladium, ruthenium, glass, ceramic and aluminum oxide. In the case of these materials, it has been found that particularly little reactive hydrogen penetrates into them. Moreover, covering units or films can be fabricated well from these materials. Furthermore, they can be secured well on the coating of a collector mirror for EUV lithography.

Advantageously, the coating locally comprises a covering coating, in particular for sealing a damaged location.

In preferred embodiments, the covering coating comprises one or more of the materials of the group molybdenum, tantalum, niobium, silicon, titanium, zirconium, hafnium, aluminum, scandium, yttrium, lanthanum, cerium, oxides thereof, nitrides thereof, carbides thereof, borides thereof, gold, platinum, rhodium, palladium, ruthenium, carbon, boron carbide and boron nitride. These materials firstly adhere well on the customary coating materials of collector mirrors for EUV lithography and secondly afford good protection against reactive hydrogen.

BRIEF DESCRIPTION OF THE DRAWINGS

The present invention will be explained in more detail with reference to preferred exemplary embodiments. In the figures:

FIG. 3 schematically shows a reflective optical element for EUV lithography having various damaged locations;

FIG. 4 shows the reflective optical element from FIG. 3 after the various damaged locations have been repaired in different ways;

DETAILED DESCRIPTION

Figure 1:
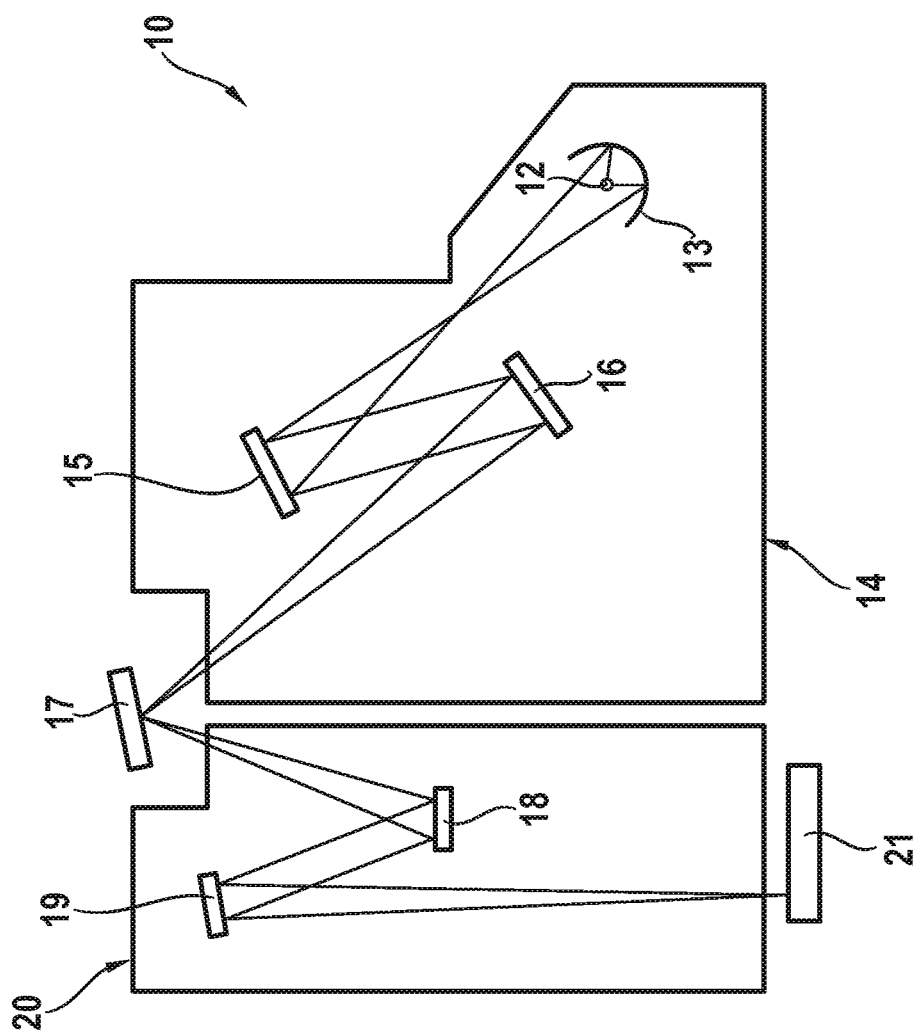
FIG. 1 schematically shows one embodiment of an EUV lithography apparatus having reflective optical elements.

FIG. 1 schematically shows an EUV lithography apparatus 10. Primary components are the illumination system 14, the photomask 17 and the projection system 20. The EUV lithography apparatus 10 is operated under vacuum conditions so that the EUV radiation in the interior thereof is absorbed as little as possible.

A plasma source or a synchrotron can serve for example as the radiation source 12. In the example illustrated here, a plasma source is used. The emitted radiation in the wavelength range of approximately 5 nm to 20 nm is firstly focused by the collector mirror 13. The operating beam is then introduced into the illumination system 14. In the example illustrated in FIG. 1, the illumination system 14 has two mirrors 15, 16. The mirrors 15, 16 guide the beam onto the photomask 17 having the structure which is intended to be imaged onto the wafer 21. The photomask 17 is likewise a reflective optical element for the EUV and soft X-ray wavelength range, which is exchanged depending on the production process. With the aid of the projection system 20, the beam reflected from the photomask 17 is projected onto the wafer 21 and the structure of the photomask is thereby imaged onto said wafer. In the example illustrated, the projection system 20 has two mirrors 18, 19. It should be pointed out that both the projection system 20 and the illumination system 14 can have in each case only one or three, four, five or more mirrors.

Figure 2:
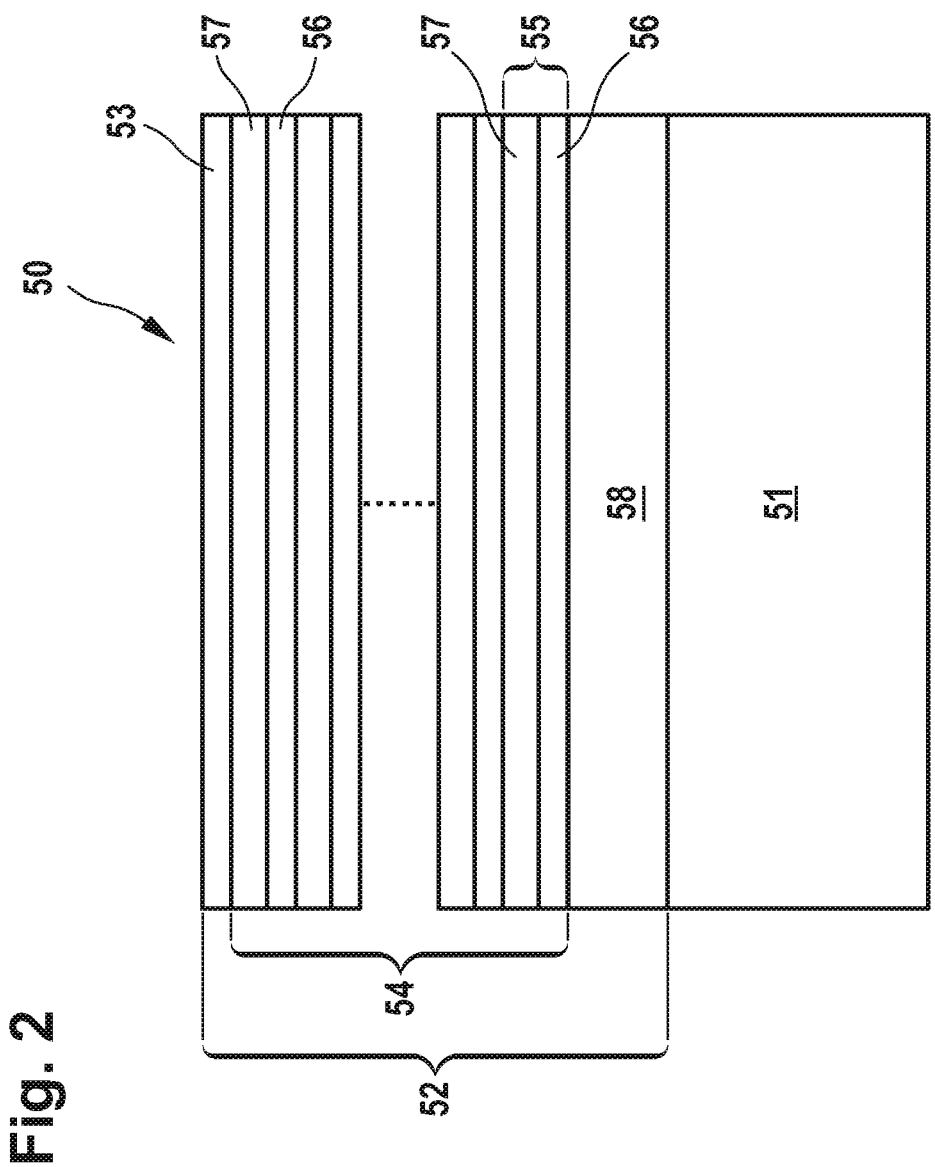
FIG. 2 schematically shows the construction of an exemplary reflective optical element for EUV lithography which is embodied as a collector mirror.

In the example illustrated here, the collector mirror 13 is a mirror 50 for quasi-normal incidence, the coating 52 of which is based on a multilayer system 54, as illustrated schematically in FIG. 2. This involves alternately applied layers of a material having a higher real part of the refractive index at the operating wavelength at which for example the lithographic exposure is carried out (also called spacer 57) and of a material having a lower real part of the refractive index at the operating wavelength (also called absorber 56), wherein an absorber-spacer pair forms a stack 55. In certain respects a crystal is thereby simulated whose lattice planes correspond to the absorber layers at which Bragg reflection takes place. The thicknesses of the individual layers 57, 56 and also of the repeating stacks 55 can be constant over the entire multilayer system 54 or vary, depending on what spectral or angle-dependent reflection profile is intended to be achieved. The reflection profile can also be influenced in a targeted manner by the basic structure composed of absorber 56 and spacer 57 being supplemented by further more and less absorbent materials in order to increase the possible maximum reflectivity at the respective operating wavelength. To that end, in some stacks absorber and/or spacer materials can be mutually interchanged or the stacks can be constructed from more than one absorber and/or spacer material. The absorber and spacer materials can have constant or varying thicknesses over all the stacks in order to optimize the reflectivity. Furthermore, it is also possible to provide additional layers as diffusion barriers between spacer and absorber layers 57, 56. A material combination that is customary for example for an operating wavelength of 13.4 nm is molybdenum as absorber material and silicon as spacer material. In this case, a stack 55 usually has a thickness of 6.7 nm, wherein the spacer layer 57 is usually thicker than the absorber layer 56.

In the example illustrated here, the coating 52 also comprises a protective layer 53, which can also consist of more than one layers, and a spectral filter layer 58, which serves to filter radiation from undesired wavelength ranges, such as, for instance, ultraviolet radiation likewise emitted by the radiation source 12 or the infrared radiation with which the plasma of the radiation source 12 is excited, from the beam path of the operating radiation in the EUV wavelength range. To that end, the spectral filter layer 58 can have a diffraction grating structure, for example. In many cases, it is composed of metal alloys, in particular of readily processable metals that are readily able to be applied in the micrometers thickness range, such as nickel-phosphorus, copper, silver or gold. By way of example, in the case of a molybdenum-silicon multilayer system, the protective layer 53 can be constructed, inter alia, from a layer of silicon nitride and a layer of ruthenium as vacuum seal. The coating 52 is arranged on a substrate 51. Typical substrate materials for reflective optical elements for EUV lithography, in particular collector mirrors, are glass ceramic, quartz glass, doped quartz glass, silicon, silicon carbide, silicon-infiltrated silicon carbide, copper, aluminum and alloys thereof.

In a variant that is not illustrated here, the collector mirror can also be configured as a mirror for grazing incidence. To that end, by way of example, on a substrate composed of a copper or aluminum alloy, said collector mirror can comprise a polishing layer composed, inter alia, of nickel-phosphorus or amorphous silicon and thereabove a ruthenium layer as coating. Optionally, said collector mirror can additionally comprise a spectral filter layer. In the case of a metallic substrate, the latter can also be structured in order to filter out ultraviolet or infrared radiation, for example, from the beam path.

In the example illustrated here, the radiation source can be a plasma radiation source in which tin droplets are excited with a $CO_2$ laser to form a plasma that emits radiation in the EUV wavelength range. In this case, tin can penetrate into the EUV lithography apparatus and deposit on, in particular, the surface of the collector mirror. In the case of the reflective optical elements disposed downstream in the beam path, the tin contamination is negligible and contamination on the basis of oxygen or carbon can primarily occur. In order to reduce in particular the tin and carbon contamination on the coatings of the reflective optical elements of an EUV lithography apparatus, they are operated in vacuo with an admixture of hydrogen at a low partial pressure. Under the influence of the EUV radiation, reactive hydrogen in the form of hydrogen radicals and hydrogen ions forms from the molecular hydrogen. Said hydrogen ions are largely converted into hydrogen radicals by wall collisions. The reactive hydrogen together with the contaminations forms volatile tin and/or carbon compounds that can be extracted by pumping.

Particularly if the coating contains defects that arose during operation or as early as during production, such as, for instance, pores, inclusions, dislocations or mechanical damage, such as scratches or cracks, for instance, penetration of reactive hydrogen into the coating can be observed, said reactive hydrogen being able to recombine within the coating or at the boundary with respect to the substrate. The conversion into molecular hydrogen leads to an increase in volume. Blisters form below the surface, which can lead to local peeling of part of or the entire coating. Delaminated locations may have a high reflectivity in the infrared range. This is problematic particularly in the case of collector mirrors if they are used in conjunction with a laser plasma radiation source from which, owing to the laser, not only EUV radiation but also infrared radiation emerge. If too much infrared radiation is coupled into the further beam path, the downstream mirrors of the optical system and the photomask could be damaged.

Hitherto, reflective optical elements damaged by the influence of hydrogen have had to be produced virtually anew by virtue of the need to remove the entire coating and coat the substrate anew.

FIG. 3 illustrates by way of example and schematically hydrogen-induced damaged locations 63, 64, 65, 66 in a coating 62 of a reflective optical element 60 for EUV lithography, for instance a collector mirror, on a substrate 61. The coating 62 can be constructed for example as explained above in the case of FIG. 2, in particular for normal or quasi-normal angles of incidence, or else as explained for grazing incidence. In the example illustrated here, the coating 62 has not been damaged down to the substrate 61, but this may occur in the case of all damaged locations.

The damaged location 63 is a blister caused by an accumulation of molecular hydrogen in the coating 62. A blister that has already burst open is illustrated as damaged location 65. In the case of the damaged location 64, that part of the coating 62 which underwent spalling has already broken away entirely and the underlying part of the coating 62 is exposed and may be damaged by contamination or indiffusing hydrogen. Disturbing infrared reflections can occur at the damaged locations 63, 64, 65.

In order then to repair the reflective optical element 60 for EUV lithography which comprises a substrate 61 and a coating 62 that reflects at an operating wavelength in the range of between 5 nm and 20 nm, firstly it is necessary to localize a damaged location in the coating. The process of localizing in particular hydrogen-induced damaged locations, specifically blisters and spalling, can take place for example through close visual inspection, since they have a macroscopic extent, for instance in the submillimeters to centimeters range, in many cases. It can also take place with the assistance of inspection systems that scan the surface of the coating.

Before the localized damaged location is then covered with one or more materials, preferably having low hydrogen permeability, coating material in the region of the damaged location can be removed before the covering process. This has taken place for example in the case of the damaged location 66 illustrated in FIG. 3 and can be carried out for example by grinding, drilling, milling or similar processes. In this case, it is possible for example to penetrate into non-delaminated regions of the coating 62 or only to open and/or remove a blister. The removal of coating material has the advantage that further delamination at the damaged location can be better prevented or the damaged location can be better covered.

Various covering possibilities are illustrated in FIG. 4 by way of example and schematically for the now repaired reflective optical element 70, which can be embodied as a collector mirror, for instance. It should be pointed out that all covering possibilities can be combined arbitrarily with all types of damaged locations.

By way of example, covering elements which can be embodied, inter alia, as a covering unit or a film can be applied to damaged locations. In the example illustrated in FIG. 4, the damaged location 63 in the form of a blister has been covered with a covering unit 71 in the form of a cap. The cap 71 is composed of a hydrogen-impermeable material such as e.g. ceramic, for example aluminum oxide, glass or metal, in particular aluminum, molybdenum, high-grade steel or Invar. The cap 71 can also be composed of tantalum, niobium, silicon, titanium, zirconium, hafnium, scandium, yttrium, lanthanum, cerium, copper, silver, gold, platinum, rhodium, palladium, ruthenium or any desired combination of two or more of these materials or the materials mentioned above or comprise one or more of the materials mentioned. The cap 71 was secured by adhesive bonding with an adhesive that exhibits little outgassing, such as, for instance, a mineral filled epoxy resin. The cap 71 can be adhesively bonded over the whole area or only in points or a ring. Overflowing adhesive is largely noncritical since it combusts during operation in the course of irradiation with EUV radiation in the presence of hydrogen. A gap in the adhesive bond should also be regarded as noncritical since the reactive hydrogen recombines to form harmless molecular hydrogen as a result of wall collisions in the gap between cap 71 and coating 62.

The cap 71 has a convex top side. This has the advantage that infrared radiation is scattered diffusely at the cap 71. In order to intensify this effect, the cap surface can additionally be roughened by sanding, sandblasting, etching or the like. Furthermore, the cap 71 can be passivated by an galvanic layer.

When choosing the cap material it is advantageous to choose the coefficient of thermal expansion to be as similar as possible to that of the substrate 61. Alternatively or additionally the cap cross section can be weakened by preferably rotationally symmetrically provided notches, grooves 711 or lamellae, as took place in the case of the cap 71 illustrated, in order to reduce thermal stresses of the cap material vis-à-vis the substrate material. In order to avoid stresses on account of different coefficients of thermal expansion, flexible cap materials may also be advantageous.

Covering elements, in particular covering units, can be adhesively bonded onto the undamaged coating 62 around a damaged location 63, 64, 65. Precisely with cap-type covering units, even in the case of a concave base such as may often be present in the case of collector mirrors, even blisters and mounds can be covered.

Particularly if the coating does not adhere very well on the substrate or a blister is too large, the coating can be removed at the corresponding damaged location partly, for example down to the spectral filter layer, or else entirely down to the substrate using, inter alia, grinding, etching, ion beam bombardment or plasma etching. The covering element, in particular a cap-type covering unit, can then be adhesively bonded on the substrate or a coating region with good adherence. It is advantageous if, in the edge region of the covering element, there are a few millimeters of undamaged coating that can be covered by the covering element in order that penetration of reactive hydrogen below the covering element is prevented as much as possible. To that end, the covering element can also comprise for example a cantilever as adhesive edge. The covering unit can moreover also be embodied for example as a lamina or a sheet.

Instead of a cap-type covering unit, a film 72 can also be applied to a damaged location, as took place in the case of damaged location 64 in the example illustrated in FIG. 4. Suitable materials have proved to be aluminum, aluminum alloys, titanium, copper, steel, silver, gold, but also ceramics and glasses through which hydrogen radicals penetrate only to a very small extent. Further suitable materials are generally metals, high-grade steel, Invar, molybdenum, tantalum, niobium, silicon, zirconium, hafnium, scandium, yttrium, lanthanum, cerium, platinum, rhodium, palladium, ruthenium, combinations of the materials mentioned or materials which comprise them or the combinations thereof. They can have thicknesses in the range of from a few atomic layers, as in the case of gold leaf, to a few hundred micrometers. One advantage of films is that they can easily be cut to size and adapted to the shape of the damaged location to be covered. As a result, they are suitable in particular for elongated and irregularly shaped damaged locations, for example also for scratches. Moreover, owing to their rather small thickness, in the event of temperature changes, they exert shear forces on an adhesive bond to a lesser extent. The negative influence of different coefficients of thermal expansion on the adhesive strength can also be reduced as a result.

Overall, they can be secured on the coating 62 using adhesives having lower adhesive strength than covering units. Furthermore, they can be removed again relatively easily if rework of the reflective optical element 70 occurs. They could be peeled off from the adhesive and adhesive residues could be removed by a cold shock.

It is advantageous, particularly in the case of collector mirrors having a curved surface, to adhesively bond the film 72 in a manner following the shape of the reflective optical element 70. To that end, beforehand the film can for example be concavely preshaped or be shaped directly on the surface using an areal, soft tool, such as a cotton swab or a foamed material stamp, for instance. Depending on the degree of curvature, however, a planar piece of film or thin sheet can also be applied. By virtue of the film having a round shape, even damaged locations in coatings of reflective optical elements having a somewhat higher degree of curvature can be repaired in a hydrogen-tight manner. It has also proved to be worthwhile in particular to preshape the film concavely and to provide one circumferential collar section or at least two collar sections as adhesive edge.

The securing of the film 72 can be carried out as explained above for the covering element 71 embodied as a cap. Preferably, a filled adhesive is used and the adhesive bonding can be carried out areally, at points or as an adhesive ring or sections thereof. Inorganic adhesive systems such as sodium silicate, for instance, can also be used.

Particularly in the case of films, however, securing by electric welding, laser welding or soldering, for example, is also possible, which can in each case also be carried out at points. Using electrostatic attraction, for example, the film, in particular, can be provisionally fixed in order to facilitate securing by welding or soldering.

It is also possible to prepare self-adhesive film pieces. By way of example, self-adhesive aluminum films with adhesive based on acrylic resin are commercially available. It is possible to apply in particular curable adhesive to a film or thin sheet or else a covering unit protected by a protective film, in order that the adhesive cures only after the removal of the protective film and after the application of the covering element in particular as a result of contact with air humidity, oxygen or UV radiation. Furthermore, a chemical activator can be sprayed on before application if the covering element, in particular in the embodiment as a film, does not comprise all the components of the adhesive and the missing component(s) must be added during application. In a further variant, the film to be applied can be covered with auxiliary films from both sides. Before the film is applied, the adhesive-side auxiliary film is removed. Afterward, the film is placed onto the damaged location to be repaired and, through pressure at points on the other auxiliary film, the adhesive-coated side of the film is secured on the coating around the damaged location. This procedure has the advantage that the size and shape of the film actually applied need only be defined at the instant of application.

In order, particularly in the case of collector mirrors, to prevent as much as possible reflection of radiation in undesired wavelength ranges into the beam path of the EUV lithography apparatus, the films can be provided with a macroscopic surface structure, as indicated by way of example as surface structure 721 in the case of the covering element 72 for example in FIG. 4. For example, they can be creased or embossed in order to reduce directional reflection of UV or IR radiation. Coarsely embossed film is commercially available. Dedicated embossing dies can also be used. In particular embossed patterns of tetrahedra have proved to be suitable for avoiding UV or IR reflections into the further beam path for EUV lithography in the case of corresponding orientation. In order to reflect IR radiation, in particular, as diffusely as possible, the films or thin sheets can be provided with a layer that reflects infrared radiation poorly, for example via anodizing, oxidation, pickling or etching for instance using acid.

In particular, covering elements can also comprise a coating corresponding to the coating of the reflective optical element to be repaired, that is to say for reflecting EUV radiation. A covering element 73 embodied as a lamina 732 having a coating 731 suitable for reflecting EUV radiation is indicated in FIG. 4. In terms of its curvature, it is advantageously adapted to the curvature of the surface of the reflective optical element 70. The lamina 732 can be produced for example from silicon, glass, sapphire or aluminum oxide or generally a metal. Depending on the material of which the coated lamina 73 is composed and the base, that is to say the part of the coating 62 or the substrate 61, on which said lamina is applied, the latter can be applied by adhesive bonding, soldering or wringing. In preferred variants, the coated lamina 73 additionally has a surface structuring in order to divert radiation from undesired wavelength ranges, in particular infrared radiation, out of the beam path.

A further possibility of repair, which moreover can readily be combined with the procedures described above, consists in applying a covering coating to the damaged location, as indicated as 74 for instance in FIG. 4. In the present example, the damaged location 66 was prepared by virtue of the fact that before the process of covering the damaged location 66, coating material in the region thereof was removed. This can be done, inter alia, with grinding, drilling or milling.

A first possibility for applying a covering coating consists in oxidizing the material exposed at the damaged location 66. This can be done for example with an acid treatment using an oxidizing acid such as nitric acid, for instance, which is suitable in particular if nickel-phosphorus is exposed. The oxidation can also be carried out by an atmospheric pressure air and/or oxygen plasma. By using an atmospheric pressure noble gas plasma, in particular comprising argon or helium, and the corresponding volatile compounds, it is also possible to apply protective coatings which comprise or consist of one or more of the materials of the group molybdenum, tantalum, niobium, silicon, titanium, zirconium, hafnium, aluminum, scandium, yttrium, lanthanum, cerium, oxides thereof, nitrides thereof, carbides thereof, borides thereof, gold, platinum, rhodium, palladium, ruthenium, carbon, boron carbide and boron nitride. With an atmospheric air plasma, exposed material at the damaged location can also be nitrided. A wide variety of commercially available atmospheric pressure plasma devices exist, inter alia ones in which the plasma unit is scarcely larger than a pin and can also be handled in this way. Such a plasma unit can be implemented manually or in an automated manner in combination with a robot arm. The second possibility is primarily preferred if gases that would be harmful to human beings are used. One particular advantage of the atmospheric pressure plasma is also that a very dense plasma can be provided in conjunction with a very low heating effect and even particularly sensitive coatings can thus be processed. Particularly if compressed air can be used as process gas for the atmospheric pressure plasma, the operating costs are very low.

A damaged location can also be repaired by electroplating and be passivated against reactive hydrogen. One example is electroplating with the aid of commercially available devices, the electroplating unit of which is configured in principle as a kind of cotton wad, which can be energized via a power terminal. Particular preference is given to galvanically applying one or more noble or semi-noble metals, in particular gold, silver, platinum or ruthenium. Further suitable materials are rhodium, palladium, molybdenum, tantalum, niobium, silicon, titanium, zirconium, hafnium, aluminum, scandium, yttrium, lanthanum and cerium. Pure metals, combinations thereof or alloys or materials containing them can be applied.

A damaged location can also be tin-plated. Particularly before the reflective optical element is intended to be intensively cleaned with hydrogen, a damaged location can be sealed by tin drops having a size in the millimeters range. To that end, the damaged location such as damaged location 66 can be prepared by ablation. A blister such as damaged location 63 can also be incipiently drilled or milled, such that the tin penetrates into the open blister. A damaged location that has already been covered with tin can additionally be covered with further layers or covering elements. It is also particularly advantageous for the tin-plated damaged location additionally to be gold-plated, for example by applying gold leaf and, if appropriate, for the latter to be secured by soldering or welding, or by galvanically applying the gold. Some other noble or semi-noble metal can also be applied instead of gold.

Figure 5B:
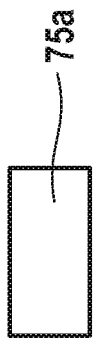
FIGS. 5B-5E schematically show various embodiments of the covering element from FIG. 5A.
Figure 5C:
Figure 5D:
Figure 5E:
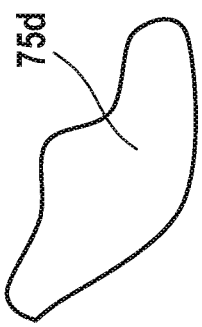
Figure 5A:
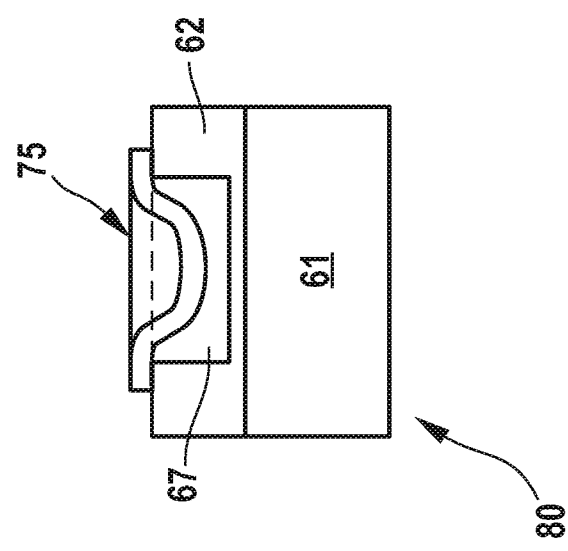
FIG. 5A schematically shows a further reflective optical element which has been repaired with the aid of a covering element.

FIG. 5A schematically illustrates a further reflective optical element embodied as a collector mirror 80. The collector mirror 80 has a damaged location 67 in its coating 62 on the substrate 61. The damaged location 67 was repaired by applying a covering element 75 embodied as a covering unit having a concave surface. The covering element 75 can be shaped in various ways in different variants. Exemplary variants are illustrated schematically in FIGS. 5B to 5E. The covering element 75a from FIG. 5B has a rectangular boundary; the covering element 75b from FIG. 5C has an elliptic boundary; the covering element 75c from FIG. 5D has a polygonal boundary; and the covering element 75d from FIG. 5E has a freeform-shaped, predominantly curved boundary. The shape of the boundary can be adapted to the shape of the respective damaged location. Particularly in the case of covering elements shaped in elongate fashion, given suitable orientation relative to the scanning direction of an EUV lithography apparatus in which the reflective optical element is used, it is possible to reduce the influence of the covering element in the form of an abrupt bright-dark transition. As a result, the imaging performance of the EUV lithography apparatus is detrimentally affected by the repair to a lesser extent.

Collector mirrors for EUV lithography which are operated with tin plasma sources and repaired in the manner described above do not exhibit hydrogen-generated blister growth at the repaired damaged locations, either after tin cleaning using hydrogen radicals or after lengthy operation with a tin plasma source.

It should be pointed out that the repair method presented here may also be suitable for repairing damaged locations in the form of scratches or cracks.

REFERENCE SIGNS

10 EUV lithography apparatus
12 EUV radiation source
13 collector mirror
14 illumination system
15 first mirror
16 second mirror
17 mask 18 third mirror
19 fourth mirror
20 projection system
21 wafer
50 reflective optical element
51 substrate
52 coating
53 protective layer
54 multilayer system
55 pair of layer
56 absorber
57 spacer
58 spectral filter layer
60 collector mirror
61 substrate
62 coating
63 damaged location
64 damaged location
65 damaged location
66 damaged location
67 damaged location
70 collector mirror
71 covering element
711 groove
72 covering element
721 surface structure
73 covering element
731 coating
732 lamina
74 covering coating
75 covering element
75a covering element
75b covering element
75c covering element
75d covering element
80 collector mirror

What is claimed is:

1. A method for repairing delamination or blistering of a coating of a reflective optical element for extreme ultraviolet (EUV) lithography which comprises a substrate and the coating that reflects at an operating wavelength in a range of between 5 nm and 20 nm, comprising:
localizing a damaged location in the coating caused by the delamination or blistering of the coating of the reflective optical element; and
covering the damaged location with one or more materials by applying a covering element localized to the damaged location;
wherein arranged on the covering element is one or more of a surface structure, a convex or concave surface or a covering element coating corresponding to the coating of the reflective optical element.

2. The method as claimed in claim 1, wherein the covering element is secured on the coating with adhesive.

3. The method as claimed in claim 1, wherein the covering element is embodied as a film or a covering unit.

4. The method as claimed in claim 1, wherein the covering element comprises one or more materials of the group metal, steel, high-grade steel, Invar, aluminum, molybdenum, tantalum, niobium, silicon, titanium, zirconium, hafnium, scandium, yttrium, lanthanum, cerium, copper, silver, gold, platinum, rhodium, palladium, ruthenium, glass, ceramic and aluminum oxide.

5. The method as claimed in claim 1, wherein said covering comprises applying a covering coating to the damaged location.

6. The method as claimed in claim 5, wherein the covering coating is applied by tin plating, gold plating, electroplating, oxidation, nitriding and/or deposition by atmospheric pressure plasma.

7. The method as claimed in claim 6, wherein said applying comprises:
applying a metal layer comprising gold, platinum, rhodium, palladium, ruthenium, molybdenum, tantalum, niobium, silicon, titanium, zirconium, hafnium, aluminum, scandium, yttrium, lanthanum and/or cerium by electroplating as the covering coating, or
applying a covering coating comprising one or more of the group molybdenum, tantalum, niobium, silicon, titanium, zirconium, hafnium, aluminum, scandium, yttrium, lanthanum, cerium, oxides thereof, nitrides thereof, carbides thereof, borides thereof, gold, platinum, rhodium, palladium, ruthenium, carbon, boron carbide and boron nitride by atmospheric pressure plasma.

8. The method as claimed in claim 1, further comprising removing coating material in a region of the damaged location before said covering of the damaged location.

9. The method as claimed in claim 1, further comprising roughening or oxidizing the damaged location prior to covering the damaged location with the one or more materials.

10. The method according to claim 1, wherein the surface structure is arranged on the covering element and is configured to reduce directional reflection of ultraviolet or infrared radiation.

11. The method according to claim 1, wherein the covering element coating is arranged on the covering element and is configured to divert ultraviolet or infrared radiation from a beam path along which the reflective optical element reflects radiation at the operating wavelength.

12. A collector mirror for EUV lithography, comprising:
a substrate and a mirror coating that reflects at an operating wavelength in a range of between 5 nm and 20 nm,
wherein the mirror coating comprises a covering element localized to a damaged location of the mirror coating, wherein the damaged location comprises delamination or blistering of the mirror coating, wherein arranged on the covering element is one or more of a surface structure, a convex or concave surface or covering element coating corresponding to the mirror coating, or a combination thereof.

13. The collector mirror as claimed in claim 12, wherein the covering element is embodied as a film or a covering unit.

14. The collector mirror as claimed in claim 12, wherein the covering element comprises one or more of the materials of the group metal, steel, high-grade steel, Invar, aluminum, molybdenum, tantalum, niobium, silicon, titanium, zirconium, hafnium, scandium, yttrium, lanthanum, cerium, copper, silver, gold, platinum, rhodium, palladium, ruthenium, glass, ceramic and aluminum oxide.

15. The collector mirror as claimed in claim 12, wherein the mirror coating locally comprises a covering coating.

16. The collector mirror as claimed in claim 15, wherein the covering coating comprises one or more of the materials of the group molybdenum, tantalum, niobium, silicon, titanium, zirconium, hafnium, aluminum, scandium, yttrium, lanthanum, cerium, oxides thereof, nitrides thereof, carbides thereof, borides thereof, gold, platinum, rhodium, palladium, ruthenium, carbon, boron carbide and boron nitride.

17. A method for repairing delamination or blistering of a coating of a reflective optical element for extreme ultraviolet (EUV) lithography which comprises a substrate and the coating that reflects at an operating wavelength in a range of between 5 nm and 20 nm, comprising:
- localizing a damaged location caused by the delamination or blistering of the coating;
- roughening or oxidizing the damaged location; and
- covering the damaged location with one or more materials by applying a covering element to the damaged location, wherein the covering element is localized to the damaged location,
- wherein arranged on the covering element is one or more of a surface structure, a convex or concave surface or a covering element coating corresponding to the coating of the reflective optical element.

18. The method as claimed in claim 17, wherein the covering element is secured on the coating with adhesive.

19. The method as claimed in claim 17, wherein the covering element comprises one or more materials of the group metal, steel, high-grade steel, Invar, aluminum, molybdenum, tantalum, niobium, silicon, titanium, zirconium, hafnium, scandium, yttrium, lanthanum, cerium, copper, silver, gold, platinum, rhodium, palladium, ruthenium, glass, ceramic and aluminum oxide.

20. The method as claimed in claim 17, wherein said covering comprises applying a covering coating to the damaged location.

* * * * *